United States Patent [19]

Botez et al.

[11] Patent Number: 4,723,252
[45] Date of Patent: Feb. 2, 1988

[54] PHASE-LOCKED LASER ARRAY

[75] Inventors: Dan Botez, Randolph Township, Morris County; Donald E. Ackley, West Amwell Township, Hunterdon County, both of N.J.

[73] Assignee: RCA Corporation, Princeton, N.J.

[21] Appl. No.: 832,213

[22] Filed: Feb. 24, 1986

[51] Int. Cl.$^4$ ................................................ H01S 3/19
[52] U.S. Cl. ............................................ 372/48; 372/50
[58] Field of Search ........................ 372/45, 46, 48, 50

[56] References Cited

U.S. PATENT DOCUMENTS

| | | | |
|---|---|---|---|
| 3,753,801 | 8/1973 | Lockwood et al. | 148/171 |
| 4,255,717 | 3/1981 | Scifres et al. | 372/50 |
| 4,347,486 | 8/1982 | Botez | 372/46 |
| 4,385,389 | 5/1983 | Botez | 372/48 |
| 4,547,396 | 10/1985 | Botez et al. | 427/87 |
| 4,594,719 | 6/1986 | Ackley | 372/50 |
| 4,641,311 | 2/1987 | Ackley | 372/18 |

OTHER PUBLICATIONS

Butler et al., Applied Physics Letters 44, 293 (1984).
Welch et al., Electronics Letters 21, 603 (1985).

Primary Examiner—James W. Davie
Attorney, Agent, or Firm—Harley R. Ball; Allen L. Limberg

[57] ABSTRACT

A phase-locked laser array comprises a substrate with two spaced-apart pluralities of channels extending towards different reflecting surfaces of the array. The axes of symmetry of the channels of one plurality are offset from the axes of symmetry of the channels of the second plurality. Coupling of light propagating in the optical waveguides over one plurality of channels into the waveguides over the second plurality of channels induces a zero phase difference between the laser oscillations of adjacent channels.

11 Claims, 6 Drawing Figures

PHASE-LOCKED LASER ARRAY

PHASE-LOCKED LASER ARRAY

The invention described herein was made in the performance of work under NASA Contract No. NAS 1-17441 and is subject to the provisions of Section 305 of the National Aeronautics and Space Act of 1958 (72 Stat. 435; 42 U.S.C. 2457).

The invention relates to a monolithic array of coupled lasing regions with means for producing zero phase difference between the optical fields in all adjacent lasing regions.

BACKGROUND OF THE INVENTION

A semiconductor injection laser typically comprises a body of semiconductor material having an active layer between clad regions of opposite conductivity type. To increase the output power, a guide layer having a refractive index which is intermediate that of the active layer and a clad region may be interposed between one of the clad regions and the active layer. Light generated in the active layer propagates in both the active and guide layer thereby forming a larger beam at the emitting facet. Because of the refractive index difference between the clad regions and the active layer, or the combination of the active and guide layers, oscillation in the direction perpendicular to the plane of the layers is restricted to the fundamental transverse mode. In the lateral direction, a direction in the plane of the layers perpendicular to the direction of light propagation, a structural variation, such as one or more channels in the substrate, is used to form an optical waveguide which restricts the oscillation to the fundamental lateral mode. Lasers incorporating transverse and lateral waveguides such as those disclosed by Botez in U.S. Pat. No. 4,347,486 may have output powers in an excess of about 40 milliwatts (mW) in the fundamental lateral and transverse mode.

To increase the output power beyond that of an individual laser, monolithic arrays of spaced apart lasing regions, such as disclosed by Botez et al. in U.S. Pat. No. 4,547,396, have been fabricated with the lasing regions coupled to one another to form a phase-locked array operating as a single source. Arrays which operate in the single longitudinal mode at an output power as high as 80 mW have been observed. However, many of these devices exhibit a far field radiation pattern in a lateral direction consisting of two lobes symmetrically located about the normal to the emitting surface of the array. This far field radiation pattern is undesirable from a systems viewpoint because a large fraction of the beam cannot be used in systems with beam-forming optics.

As discussed by Butler et al., Applied Physics Letters 44, 293 (1984), this far field distribution can be understood from gain considerations that cause adjacent lasing regions to operate such that their relative phase is 180°. It would thus be desirable to have a phase-locked laser array which included a means for reducing the likelihood of an array operating with 180° phase difference between adjacent lasing regions.

SUMMARY OF THE INVENTION

A phase-locked laser array comprises a body of semiconductor material with a pair of reflecting surfaces to form the laser cavity. The body includes a substrate having first and second pluralities of channels extending a distance into the substrate from a surface thereof, with the axes of symmetry of the channels of the two pluralities being offset from one another. The two pluralities of channels are spaced apart from one another with each of the pluralities extending towards different reflecting surfaces. Laser oscillations in a cavity region overlying the substrate will then be centered over the channels. Because of the offset between the axes of symmetry of the channels in the two pluralities, mixing of the modes of oscillation will occur which will favor zero degree phase difference between the oscillations over adjacent channels.

DETAILED DESCRIPTION OF THE PREFERRED EMBODIMENTS

In the FIGURES the same elements of the laser arrays of the invention have the same numerical identification.

Figure 1:
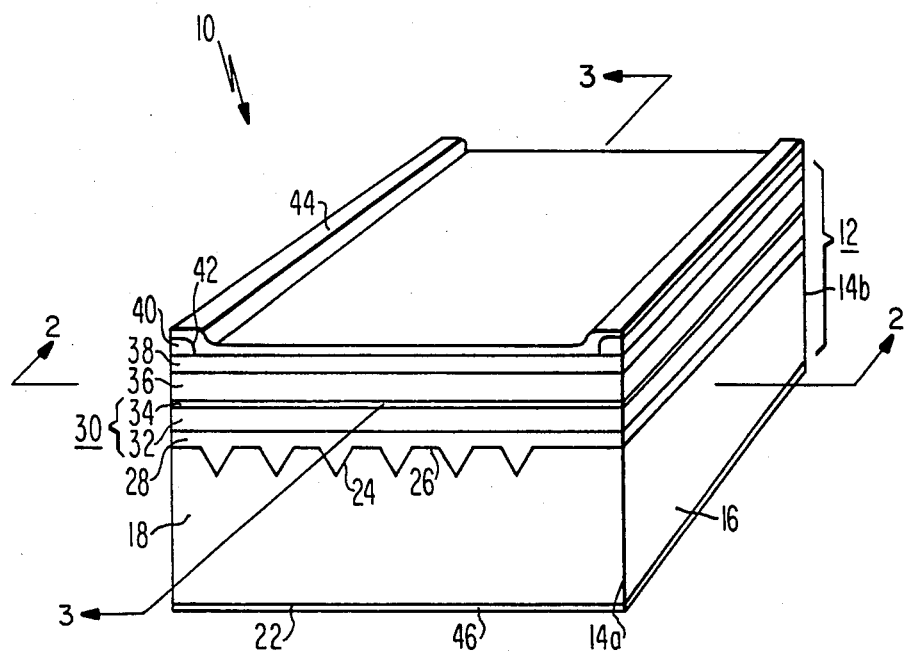
FIG. 1 is a perspective view of a laser array of the invention.
Figure 2:
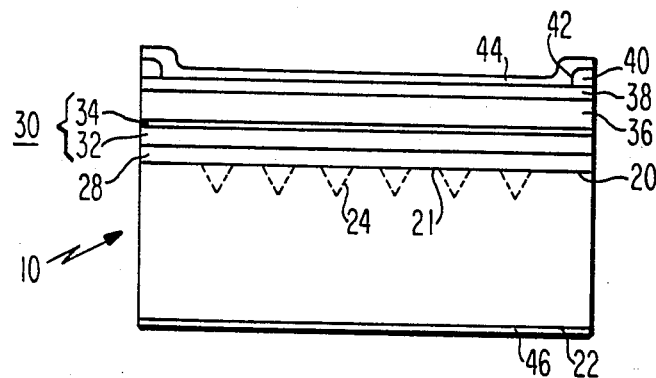
FIGS. 2 and 3 are cross-sectional views along the lines 2—2 and 3—3 of FIG. 1, respectively.
Figure 3:
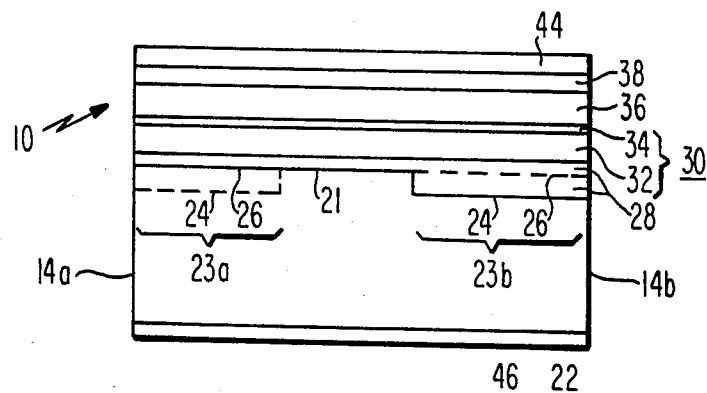

In FIGS. 1-3, a laser array 10 comprises a body 12 of semiconductor material having spaced, parallel reflecting surfaces 14a and 14b with the reflecting surface 14a being partially transparent so that laser light may be emitted therefrom. The body 12 also includes spaced-apart side surfaces 16 which extend between the reflecting surfaces 14a and 14b.

Figure 4:
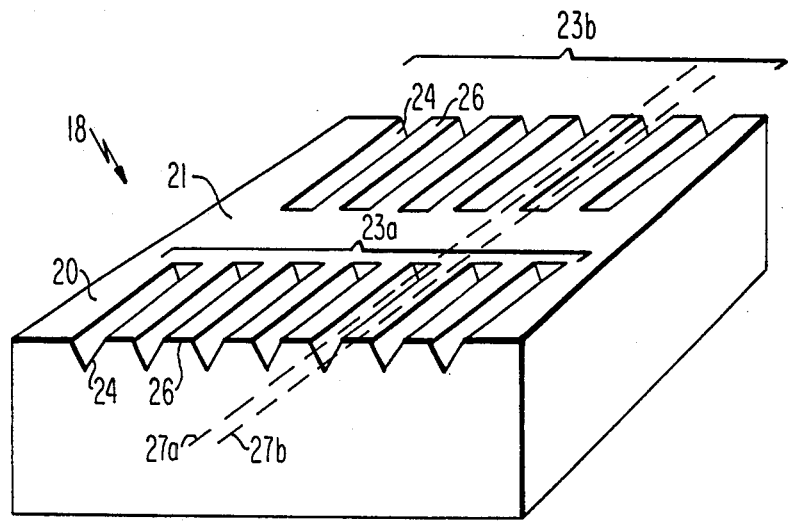
FIG. 4 is a perspective view of the substrate incorporated in the array of the invention.

The semiconductor body 12 includes a substrate 18 having first and second major surfaces 20 and 22, respectively, which extend between the reflecting surfaces 14a and 14b and the side surfaces 16. As shown in FIG. 4, the first major surface 20 has therein spaced-apart first and second pluralities 23a and 23b, respectively, of channels 24 with lands 26 therebetween. The channels 24 extend a distance into the substrate 18 from the first major surface 20. The two pluralities of channels are separated by a transition region 21 which extends transversely, preferably substantially perpendicularly, to the channels 24. The axes of symmetry of the channels 24 of the first and second pluralities 23a and 23b, respectively, extend in the longitudinal direction, the direction perpendicular to the reflecting surfaces 14a and 14b and parallel to the first major surface 20. The axes of symmetry of the channels 24 of the pluralities 23a and 23b, as illustrated by the dotted lines 27a and 27b, respectively, in FIG. 4 are offset from another in the lateral direction, the direction perpendicular to the axes of symmetry and in the plane of the first major surface 20.

A first clad region 28 overlies the major surface 20, the transition region 21, the channels 24 and the lands 26. A cavity region 30, which overlies the first clad region 28, includes a guide layer 32 overlying the first clad region 28 and an active layer 34 overlying the guide layer 32. A second clad region 36 overlies the cavity region 30 and a capping layer 38 overlies the second clad region 36. An electrically insulating layer 40 having an opening 42 extending therethrough over the channels 24 overlies the capping layer 38. A first electrical contact 44 overlies the capping layer 38 in the opening 42. A second electrical contact 46 overlies the second major surface 22.

Figure 5:
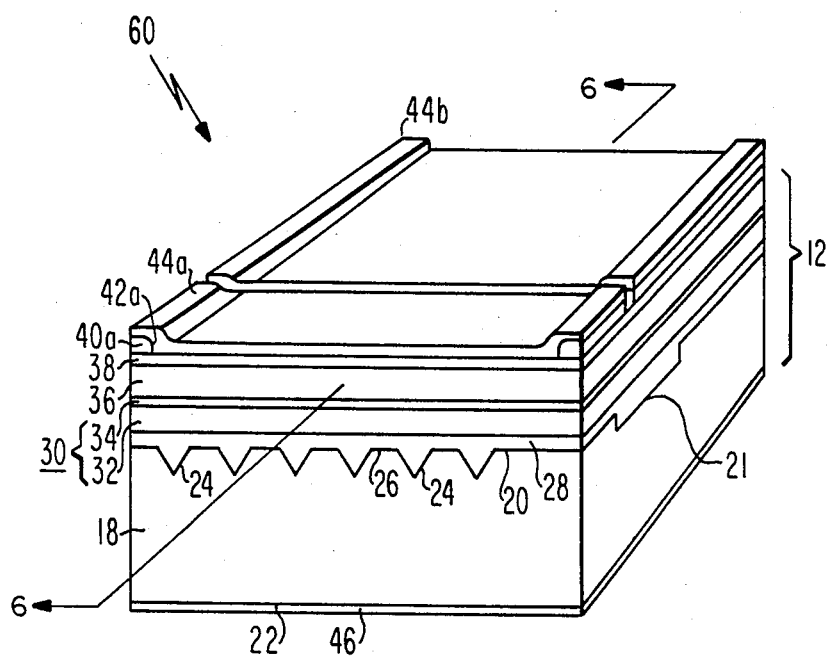
FIG. 5 is a perspective view of a second embodiment of the laser array of the invention.
Figure 6:
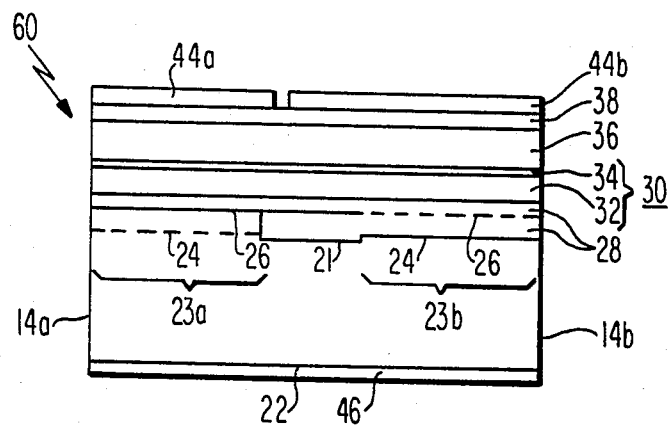
FIG. 6 is a cross-sectional view along the line 6—6 of FIG. 5.

In FIGS. 5 and 6, a phase-locked laser array 60 is identical to the array 10, as shown in FIGS. 1-3, except that the first electrical contact 44 overlying the cap layer 38 is segmented into first and second subcontacts 44a and 44b respectively. The first subcontact 44a is over the first plurality 23a. The second subcontact 44b is over the second plurality 23b and the transition region 21. Preferably the first plurality 23a of channels 24 extend toward the reflecting surface 14a through which light is emitted from the array. In addition, the transition region 21 is illustrated as comprising a channel extending a distance into the substrate 18 from the surface 20.

The materials used for the array should be such that the refractive index of the active layer 34 is greater than the refractive index of the guide layer 32 which, in turn, is greater than the refractive indices of the first and second clad regions 28 and 36, respectively. The array may be formed of materials such as GaAs and AlGaAs alloys which have the requisite refractive index differences. Alternatively, alloys of other Group III and Group V elements including In, P and Sb may be used.

The array of the invention may be fabricated using well-known photolithographic masking and etching techniques to form the channels followed by standard liquid-phase epitaxy techniques to deposit the layers over the surface containing the channels. Typically, selective chemical etching of a substrate surface having a particular crystallographic orientation is used to form channels of the desired shape. Suitable liquid-phase epitaxy techniques have been disclosed by Lockwood et al. in U.S. Pat. No. 3,753,801, Botez in U.S. Pat. No. 4,347,486 and by Botez et al. in U.S. Pat. No. 4,547,396, all of which are incorporated herein by reference.

The substrate 18 and the first clad region 28 are of one conductivity type and the second clad region 36 and the capping layer 38 are of the opposite conductivity type. The guide layer 32 is preferably positioned between the first clad region 28 and the active layer 34, as shown in FIG. 1 and, in this case has the same conductivity type as the first clad region 28. In some applications the guide layer 32 may be positioned between the active layer 34 and the second clad region 36, in which case the guide layer 32 has the same conductivity type as the second clad region 36. In other applications the guide layer 32 may not be present.

The substrate 18 is preferably composed of N-type GaAs having a first major surface 20 which is parallel to or slightly misoriented from the (100) crystallographic plane. It is to be understood that the substrate 18 is also meant to include an epitaxial layer on the surface 20 in which the channels 24 are formed or through which the channels 24 extend into the substrate 18.

The pluralities of channels 23a and 23b are separated by the transition region 21 and extend from the transition region 21 towards different reflecting surfaces and may contact these surfaces as shown in the FIGURES.

The channels 24 within a plurality are preferably substantially parallel and uniformly spaced and are typically between about 1.5 and 2.5 micrometers ($\mu$m) deep, having a width at the first major surface 20 between about 3 and 4 $\mu$m with a typical center-to-center spacing between about 4 and 8 $\mu$m. Preferably the center-to-center spacing and the dimensions of the channels of the two pluralities are the same. The channels 24 are typically V-shaped but may have another shape such as a rectangular or square shape. A channel 24 together with the spatially varying thickness of the overlying first clad region 28 provides a refractive index waveguide over the channel 24 which defines a lasing region of the array. The offset between the axes of symmetry of the channels of the two pluralities is greater than zero and less than the center-to-center spacing between adjacent channels. Preferably the two pluralities of channels 24 are offset from one another such that the axes of symmetry 27a of the first plurality 23a bisects the lands 26 of the second plurality 23b and vice versa as shown in FIG. 4. In the embodiment of FIGS. 1-3, the channels 24 of the pluralities 23a and 23b typically are of equal length and are typically between about 50 and 150 $\mu$m in length. In the embodiment of FIGS. 5-6, the channels 24 of the first plurality 23a are typically much shorter in length than the channels 24 of the second plurality 23b and are typically between about 20 and 30 $\mu$m in length.

The transition region 21 may be a flat portion of the surface 20 as shown in FIGS. 1-4 if the material comprising the substrate 18 is non-absorbing at the laser wavelength. Alternatively, if the substrate is absorbing at the laser wavelength, the transition region 21 preferably comprises a channel extending a distance into the substrate 18 from the surface 20 as shown in FIGS. 5-6. The depth of this channel is typically the same as that of the channels 24. The transition region 21 typically has a width between about 5 and 25 $\mu$m between the first and second pluralities 23a and 23b respectively.

The first clad region 28 is typically composed of N-type $Al_rGa_{1-r}As$ where r is between about 0.2 and 0.45 and preferably about 0.4. The region 28 is comparatively thin over the lands 26 between the channels 24, being between about 0.1 and 0.4 $\mu$m thick, and preferably has a substantially planar surface upon which the succeeding layers and regions are deposited. The guide layer 32, if present, is typically composed of N-type $Al_xGa_{1-x}As$ where x is between about 0.15 and 0.3 and is preferably between about 0.18 and 0.25. This layer is typically between about 0.3 and 0.6 $\mu$m thick and is preferably about 0.4 $\mu$m thick. The active layer 34 is typically composed of $Al_yGa_{1-y}As$ where y is between about 0.0 and 0.15, typically between about 0.03 and 0.15, and is typically between about 0.05 and 0.12 $\mu$m thick. The second clad region 36 is typically between about 0.8 and 1.5 $\mu$m thick and is composed of P-type $Al_zGa_{1-z}As$ where z is between about 0.25 and 0.45 and is preferably about 0.4. The capping layer 38 is typically between about 0.5 and 1.0 $\mu$m thick and is composed of P-type GaAs. This layer is used to facilitate ohmic electrical contact between the underlying semiconductor material and an overlying electrical contact.

The electrically insulating layer 40 is preferably composed of a silicon oxide which is deposited on the capping layer 38 by pyrolytic decomposition of a silicon-containing gas such as silane in oxygen or water vapor. The opening 42 is formed using standard photolithographic masking techniques and etching processes. Alternatively the insulating layer 40 may have a plurality of openings over the channels 24 with the first electrical contact 44 overlying the capping layer 38 in these openings to form a plurality of electrically-connected stripe contacts to the body 12. The first electrical contact 44 is preferably composed of sequentially evaporated titanium, platinum and gold layers. The second electrical contact 46 is formed by sequential evaporation of germanium, gold, nickel and gold followed by a sintering step.

In addition, means other than the electrically insulating layer 40 may be used to confine the electrical current flow. For example, a region of opposite conductivity type to that of the substrate 18 can be interposed between the lands 26 and the first clad region 28 or can be incorporated into a buffer layer on the major surface 20 through which the channels 24 extend. Alternatively, the cap layer 38 may be of the opposite conductivity type to that of the second clad region 36 with regions of the same conductivity type as that of the second clad region 36 extending therethrough over the channels 24. The combination of the electrical contacts 44 and 46 together with the insulating layer 40 or other means for confining the current flow, if present, comprise a means for providing electrical contact to the semiconductor body 12.

In the operation of the array 10 a bias voltage of the proper polarity is applied to the electrical contacts of the semiconductor body, producing spaced-apart lasing regions in the cavity region over the channels. The lateral variation in the separation between the cavity region and the substrate in the vicinity of a channel, together with absorption to the substrate in regions between channels, and with the transverse variation in the bulk refractive indices, produces a lateral variation in the transverse in real and imaginary parts of the refractive index thereby forming a local refractive-index guide in the lateral direction for light propagation in each channel. The evanescent tails of the radiation distribution in the lateral direction in the waveguide over a particular channel provide the coupling between the lasing regions over adjacent channels. In most arrays gain considerations when coupling between lasing regions over each channel occurs cause the adjacent regions to operate such that their relative phase difference is 180°. In the array of the invention, however, the two pluralities of channels are offset from one another and separated by the unguided region above the transition region 21. The lateral waveguide is not present over the transition region 21 so that light exiting, for example, from the lasing regions over the channels of the second plurality 23b is diffracted in the lateral direction and a portion thereof is coupled into the lasing regions over the offset channels 24 of the first plurality 23a. This diffractive coupling between the lasing regions over the first and second pluralities occurs best when the oscillation over adjacent lasing regions have a zero degree phase difference. Thus, 0°-phase-shift operation has least loss and subsequently low threshold, and will be preferred to occur over 180°-phase-shift operation.

In the operation of the array 60 the subcontacts 44a and 44b are independently energized. Thus the current through the lasing regions over the first plurality of channels 44a can be varied independently from the current flow through the lasing regions over the second plurality 23b and the transition region 21. The length of the channels 24 beneath the subcontact 44b between the reflecting surfaces is preferably sufficient so that laser action can occur thereunder, while the length of the channels 24 beneath the subcontact 44a is preferably such that laser action cannot occur thereunder. Typically the current flow through the second subcontact 44b is sufficient for laser action to occur thereunder. The laser gain in this section is then clamped at the current threshold for laser action. Since the length of the subcontact 44a is short, this section will not exhibit laser action and the gain will continue to increase with increasing current. The index waveguides over the first plurality 23a of channels 24 will then, with this pumping action and resulting in high gain, serve as an amplifier for the laser oscillations generated in the waveguides over the second plurality 23b. In addition, because of the resulting difference in gain the optical loss of the in-phase mode can be minimized without affecting the lasing operation, thereby favoring in phase operation of adjacent elements of the array.

We claim:

1. A phase-locked laser array comprising:
   a body of semiconductor material having first and second reflecting surfaces, at least one of which is partially transparent at the laser wavelength;
   said body including:
   a substrate having first and second opposed major surfaces;
   first and second spaced-apart pluralities of channels with lands therebetween extending a distance into said substrate from said first major surface with each of said pluralities extending toward a different reflecting surface of said body, the axes of symmetry of the channels of the two pluralities being offset from one another in the lateral direction;
   a first clad region overlying said channels and said lands;
   a cavity region overlying said first clad region;
   a second clad region overlying said cavity region; and
   means for electrically contacting said body;
   wherein the channels of each plurality are spaced an effective distance apart such that the optical fields in the cavity region over adjacent channels are coupled to one another.

2. The array of claim 1 wherein said pluralities are spaced apart by a transition region extending transverse to the axes of symmetry of the channels.

3. The array of claim 2 wherein said transition region comprises a channel extending a distance into said substrate from said first major surface.

4. The array of claim 3 wherein the axes of symmetry of the channels of said first plurality bisect the lands between the channels of said second plurality.

5. The array of claim 2 wherein said transition region comprises a flat portion of said first major surface.

6. The array of claim 5 wherein the axes of symmetry of the channels of said first plurality bisect the lands between the channels of said second plurality.

7. The array of claim 2 wherein said means for electrically contacting said body includes a first electrical contact overlying said second clad region over said channels.

8. The array of claim 7 wherein said first contact comprises a first subcontact overlying said second clad region over said first plurality and a second subcontact, spaced apart from said first subcontact, overlying said second clad region over said second plurality and said flat portion.

9. The array of claim 2 wherein said means for electrically contacting said body includes a first electrical contact overlying said second clad region over said channels.

10. The array of claim 9 wherein said first contact comprises a first subcontact overlying said second clad region of said first plurality and a second subcontact, spaced apart from said first subcontact, overlying said second clad region over said second plurality.

11. The array of claim 10 wherein the axes of symmetry of the channels of said first plurality bisect the lands between the channels of said second plurality.

* * * * *